US009067342B2

(12) United States Patent
Simion

(10) Patent No.: US 9,067,342 B2
(45) Date of Patent: Jun. 30, 2015

(54) MOLD CHASE FOR INTEGRATED CIRCUIT PACKAGE ASSEMBLY AND ASSOCIATED TECHNIQUES AND CONFIGURATIONS

(71) Applicant: INTEL CORPORATION, Santa Clara, CA (US)

(72) Inventor: Bogdan M. Simion, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 182 days.

(21) Appl. No.: 13/627,487

(22) Filed: Sep. 26, 2012

(65) Prior Publication Data

US 2014/0084478 A1    Mar. 27, 2014

(51) Int. Cl.
| | |
|---|---|
| H01L 21/56 | (2006.01) |
| B29C 37/00 | (2006.01) |
| B29C 43/28 | (2006.01) |
| H01L 25/10 | (2006.01) |
| H01L 23/498 | (2006.01) |
| H01L 23/00 | (2006.01) |
| H01L 25/065 | (2006.01) |
| H01L 25/18 | (2006.01) |

(52) U.S. Cl.
CPC .............. *B29C 37/0075* (2013.01); *B29C 43/28* (2013.01); *H01L 2224/16225* (2013.01); *H01L 2225/06555* (2013.01); *H01L 2225/1088* (2013.01); *H01L 21/565* (2013.01); *H01L 21/566* (2013.01); *H01L 24/13* (2013.01); *H01L 24/16* (2013.01); *H01L 24/32* (2013.01); *H01L 24/73* (2013.01); *H01L 24/92* (2013.01); *H01L 24/97* (2013.01); *H01L 25/0657* (2013.01); *H01L 25/105* (2013.01); *H01L 25/18* (2013.01); *H01L 2224/131* (2013.01); *H01L 2224/16238* (2013.01); *H01L 2224/32225* (2013.01); *H01L 2224/73204* (2013.01); *H01L 2224/92125* (2013.01); *H01L 2224/97* (2013.01); *H01L 2225/06517* (2013.01); *H01L 2225/1023* (2013.01); *H01L 2225/1058* (2013.01); *H01L 2924/1432* (2013.01); *H01L 2924/1434* (2013.01); *H01L 2924/15321* (2013.01); *H01L 2924/15331* (2013.01); *H01L 2924/18161* (2013.01); *H01L 23/49811* (2013.01); *H01L 23/49833* (2013.01)

(58) Field of Classification Search
USPC ................ 425/125, 127, 129.1, 577; 249/176
See application file for complete search history.

(56) References Cited

U.S. PATENT DOCUMENTS

| | | | | | |
|---|---|---|---|---|---|
| 3,384,335 | A | * | 5/1968 | Schwarz | 249/67 |
| 5,093,057 | A | * | 3/1992 | Hara et al. | 264/112 |
| 5,622,873 | A | * | 4/1997 | Kim et al. | 438/65 |

(Continued)

*Primary Examiner* — Robert B Davis
(74) *Attorney, Agent, or Firm* — Schwabe, Williamson & Wyatt, P.C.

(57) ABSTRACT

Embodiments of the present disclosure are directed towards a mold chase for integrated circuit package assembly and associated techniques and configurations. In one embodiment, a method includes receiving a package substrate, the package substrate including a first die mounted on the package substrate by a plurality of first interconnect structures, and a plurality of second interconnect structures disposed on the package substrate and configured to route electrical signals of a second die, protecting a top surface of individual interconnect structures of the plurality of second interconnect structures from deposition of a mold material, and depositing the mold material on the package substrate between the individual interconnect structures of the plurality of second interconnect structures. Other embodiments may be described and/or claimed.

10 Claims, 7 Drawing Sheets

(56) References Cited

U.S. PATENT DOCUMENTS

| | | | |
|---|---|---|---|
| 5,639,403 A * | 6/1997 | Ida et al. | 264/40.1 |
| 5,824,252 A * | 10/1998 | Miyajima | 264/272.17 |
| 5,897,338 A * | 4/1999 | Kaldenberg | 438/116 |
| 5,914,531 A * | 6/1999 | Tsunoda et al. | 257/668 |
| 6,441,503 B1 * | 8/2002 | Webster | 257/787 |
| 6,863,516 B2 * | 3/2005 | Williams | 425/129.1 |

\* cited by examiner

MOLD CHASE FOR INTEGRATED CIRCUIT PACKAGE ASSEMBLY AND ASSOCIATED TECHNIQUES AND CONFIGURATIONS

FIELD

Embodiments of the present disclosure generally relate to the field of integrated circuits, and more particularly, to a mold chase for integrated circuit package assembly and associated techniques and configurations.

BACKGROUND

Package-on-package (POP) assemblies are emerging to combine package substrates that have one or more dies mounted on the respective package substrates to provide a higher component density in electronic devices such as, for example, mobile computing devices. Present POP assemblies may incorporate an interposer or similar substrate between the package substrates of a POP assembly to facilitate routing of electrical signals between dies of the package substrates. However, the interposer may increase a dimension (e.g., a Z-direction) of a POP assembly in a direction perpendicular to package substrate surfaces (e.g., X and Y directions) having the one or more dies mounted thereon. Currently, there is pressure to decrease the dimensions of the POP assembly to accommodate smaller mobile computing devices by eliminating the interposer.

One emerging solution utilizes the formation of vias in a mold compound to route electrical signals between package substrates of a POP assembly. The mold material may be deposited on a package substrate and, subsequently, a laser drilling process may be used to form vias through the mold material. However, the laser drilling process may be a costly additional operation due to the extensive time of the laser drilling and/or the additional operational step/equipment needed in a manufacturing setting to support the laser drilling. Additionally, laser drilling may provide vias having a conical profile with sloped sidewalls that may increase a likelihood that solderable material at a top portion of the laser-drilled vias will bridge and cause shorting of interconnect structures formed by the solderable material. Such likelihood of bridging in laser-drilled vias may increase as interconnect structures increase in density with smaller pitch between the interconnect structures to provide a smaller form factor of a POP assembly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
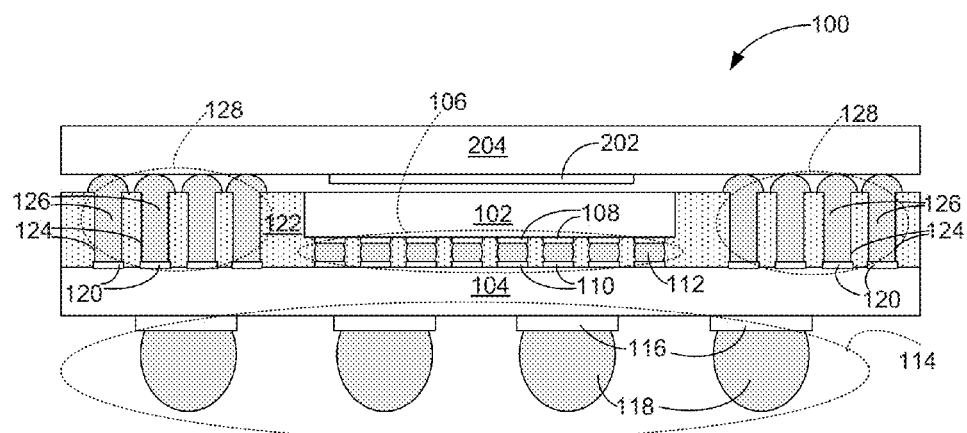
FIG. 1 schematically illustrates an example cross-section side view of an integrated circuit (IC) package assembly, in accordance with some embodiments.

Embodiments of the present disclosure describe a mold chase for integrated circuit package assembly and associated techniques and configurations. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical and/or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates an example cross-section side view of an integrated circuit (IC) package assembly 100, in accordance with some embodiments. The IC package assembly 100 may be a package-on-package (POP) assembly, according to various embodiments.

The IC package assembly 100 may include a first package substrate 104 and a second package substrate 204 coupled together. The first package substrate 104 may include one or more dies (hereinafter "first die 102") attached to a surface of the first package substrate 104. In the depicted embodiment, the first die 102 is coupled with the first package substrate 104 in a flip-chip configuration. In the flip-chip configuration, an active side of the first die 102 may be coupled to the first package substrate 104 using first interconnect structures 106, as can be seen. For example, pads 108 on the active side of the first die 102 may be coupled with corresponding pads 110 formed on the first package substrate 104 using solderable material 112 (e.g., bumps). In some embodiments, the first interconnect structures 106 may electrically and/or mechanically couple the first die 102 with the first package substrate 104.

Mold material 122 may be disposed on the first package substrate 104, as can be seen. The mold material 122 may include, for example, epoxy materials or other suitable materials to electrically insulate electrical features of the IC package assembly 100. In some embodiments, the mold material 122 may be disposed on the first package substrate 104 between individual interconnect structures of the second interconnect structures 128, as can be seen. In some embodiments, the mold material 122 may serve as an underfill material to fill or substantially fill a region between the first die 102 and the first package substrate 104 and/or between individual interconnect structures of the first interconnect structures 106. In the depicted embodiment, the mold material 122 serves as an underfill and partial encapsulant for a first die 102 having an exposed surface. The mold material 122 may partially or fully encapsulate the first die 102, according to various embodiments.

The first package substrate 104 may be configured to route electrical signals between the first die 102 and other electronic devices. In some embodiments, second interconnect structures 128 are disposed on the first package substrate 104 and configured to route electrical signals of a second die 202, which may be mechanically and/or electrically coupled to the second package substrate 204 using similar techniques and configurations as described in connection with the first package substrate 104. The second interconnect structures 128 may include, for example, pads 120 disposed on the first package substrate 104, as can be seen, and solderable material (e.g., solder balls) 126 disposed on the pads 120 in vias 124 formed in the mold material 122. The vias 124 may have a precise cylindrical profile as a result of being formed by pins having the precise cylindrical profile. In some embodiments, the second interconnect structures 128 may be arranged on the first package substrate 104 to surround the first die 102.

The second interconnect structures 128 may be coupled with corresponding pads (not shown) on the second package substrate 204 that route electrical signals to and/or from the second die 202. The first package substrate 104 and the second package substrate 204 may include additional routing features such as traces, vias, trenches, pads, build-up layers and/or other structures that are not depicted for the sake of clarity, but which may provide electrical routing for the electrical signals between dies (e.g., first die 102 and second die 202) mounted on the respective package substrates. In some embodiments, the package substrates 104 and 204 are epoxy-based laminate substrates having a core and/or build-up layers such as, for example, an Ajinomoto Build-up Film (ABF) substrate. The package substrates 104 and 204 may include other suitable types of substrates in other embodiments.

In some embodiments, the first interconnect structures 106 and the second interconnect structures 128 are configured to route electrical signals between the first die 102 and the second die 202 and/or electrical signals between each of the first die 102 and second die 202 and another electronic device such as, for example, a circuit board (e.g., motherboard) by way of package-level interconnect structures 114. The package-level interconnect structures 114 may include, for example, pads 116 disposed on the first package substrate 104 and solderable material 118 (e.g., solder balls) disposed on the pads 116. The electrical signals may include, for example, input/output (I/O) signals and/or power/ground signals.

The depicted IC package assembly 100 shows the second die 202 coupled to the first package substrate 104 through the second package substrate 204. In other embodiments, the second die 202 may be directly coupled to the second interconnect structures 128. In some embodiments, the first die 102 may be a processor and the second die 202 may be memory. Subject matter is not limited to these examples and the first die 102 and the second die 202 may be configured to perform other functions in other embodiments.

Figure 2:
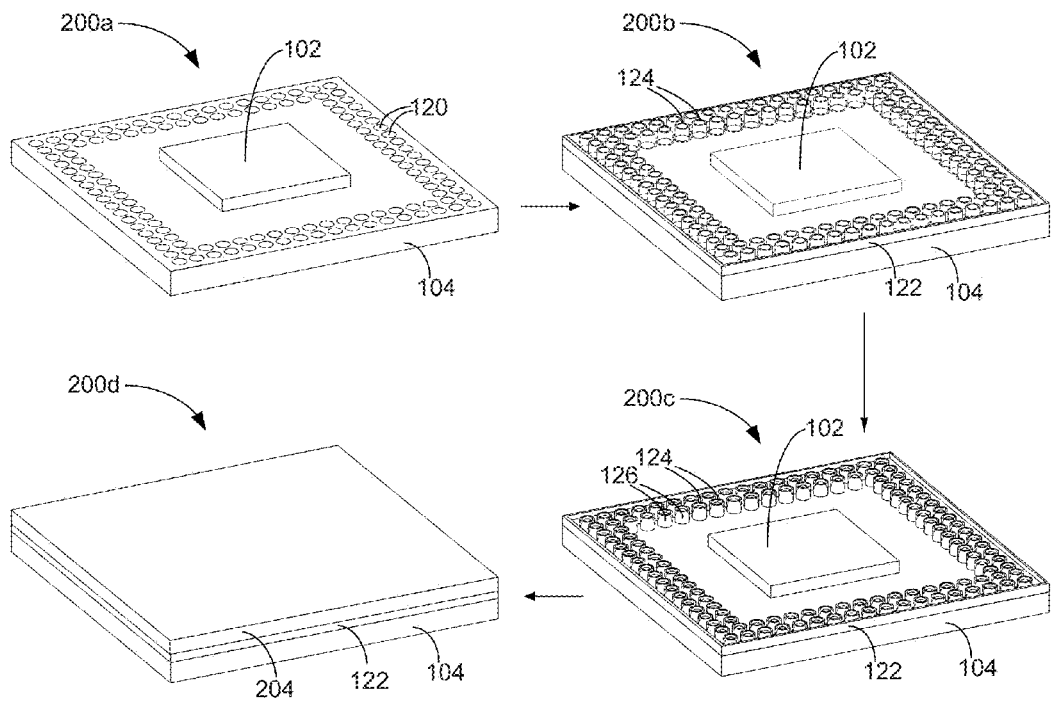
FIG. 2 schematically illustrates an example perspective view of an IC package assembly subsequent to various operations, in accordance with some embodiments.

FIG. 2 schematically illustrates an example perspective view of an IC package assembly subsequent to various operations, in accordance with some embodiments. The IC package assemblies 200a, 200b, 200c and 200d may comport with embodiments described in connection with IC package assembly 100 of FIG. 1.

The IC package assembly 200a is depicted subsequent to attaching a first die 102 to a first package substrate 104 using, for example, first interconnect structures (e.g., first interconnect structures 106 of FIG. 1) and forming pads 120 on a surface of the first package substrate 104, as can be seen. In the depicted embodiment, the pads 120 surround the first die 102. Although the depicted pads 120 are circular, the pads 120 may have other shapes in other embodiments including rectangular shapes.

The IC package assembly 200b is depicted subsequent to simultaneously depositing mold material 122 on the first package substrate 104 and forming vias 124 in the mold material 122 (e.g., using techniques and configurations described in connection with FIGS. 6-10) that provide openings through the mold material 122 to the pads 120. For the sake of clarity, the mold material 122 in FIGS. 2-5 is depicted only as a layer around the periphery of the first package substrate 104 and as cylinder portions directly around each of the vias 124 to clearly show a profile of the vias, however, the mold material 122 may extend to and abut side edges of the first die 102, and/or may underfill a region between the first die 102 and the first package substrate 104, and/or may encapsulate the first die 102, according to various embodiments.

The IC package assembly 200c is depicted subsequent to depositing solderable material 126 in the vias 124 to form second interconnect structures (e.g., second interconnect structures 128 of FIG. 1) to route electrical signals of a second die. The solderable material 126 may, for example, include solder balls that are reflowed to the pads 120 through the vias 124.

The IC package assembly 200d is depicted subsequent to attaching a second package substrate 204 including the second die (e.g., second die 202 of FIG. 1) to the first package substrate 104 via the solderable material 126 to form a POP assembly. In other embodiments, the second die may be directly coupled to the first package substrate 104 using the solderable material 126 in the vias 124.

Figure 3:
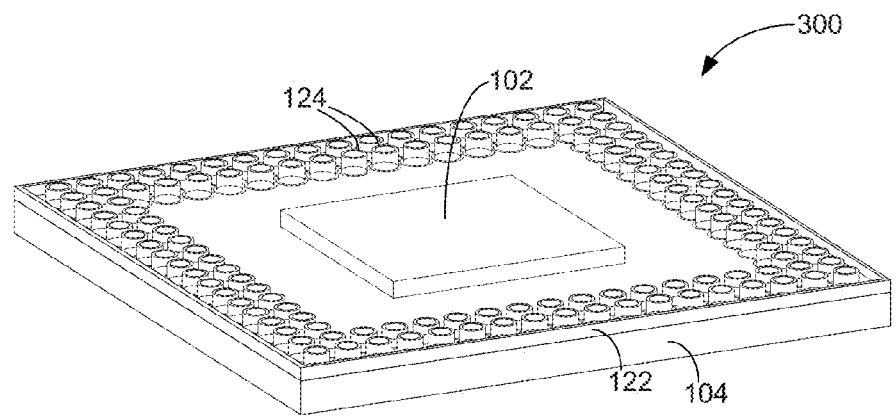
FIG. 3 schematically illustrates an example perspective view of a first IC package assembly subsequent to deposition of mold material, in accordance with some embodiments.
Figure 4:
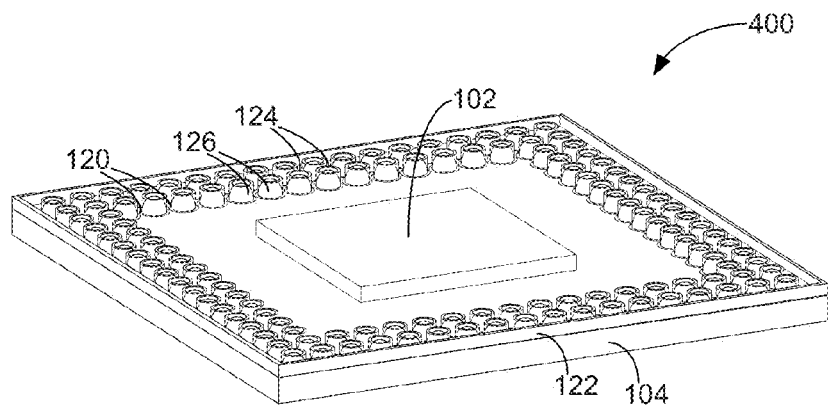
FIG. 4 schematically illustrates an example perspective view of a second IC package assembly subsequent to deposition of mold material, in accordance with some embodiments.
Figure 5:
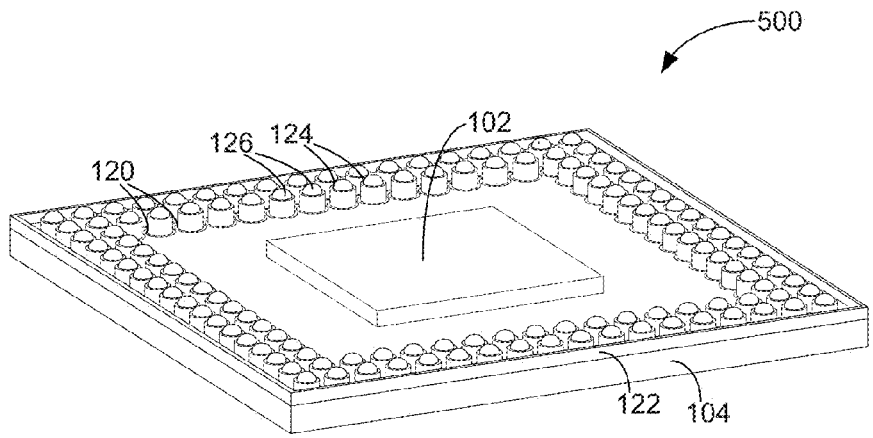
FIG. 5 schematically illustrates an example perspective view of a third IC package assembly subsequent to deposition of mold material, in accordance with some embodiments.
Figure 6:
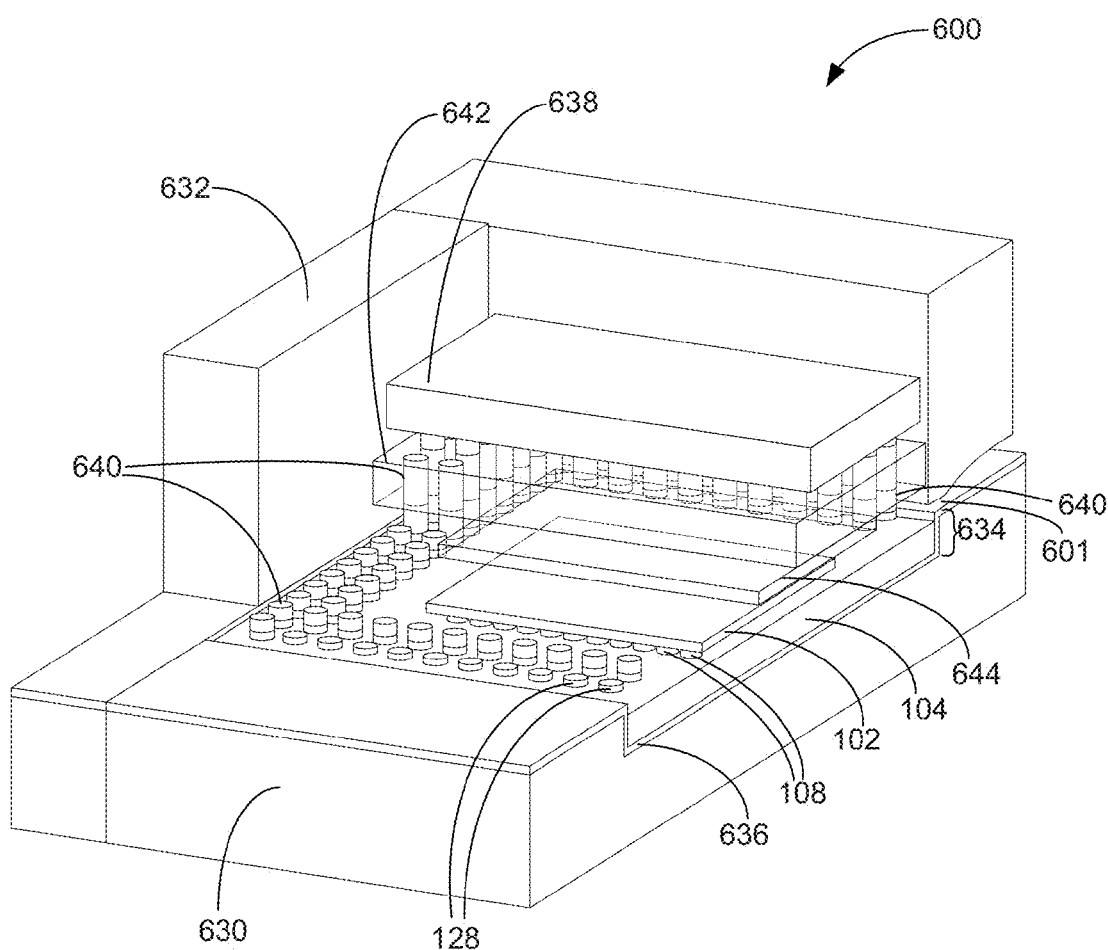
FIG. 6 schematically illustrates an example layer-by-layer perspective view of a mold chase, in accordance with some embodiments.

FIGS. 3-5 schematically illustrate an example perspective view of respective IC package assemblies 300, 400 and 500 subsequent to deposition of a mold material 122 using a mold chase as described herein (e.g., mold chase 600 of FIG. 6). The IC package assemblies 300, 400 and 500 may represent the respective package assemblies directly after processing by the mold chase and prior to any further processing. According to various embodiments, the IC package assemblies 300, 400 and 500 may comport with embodiments described in connection with IC package assemblies of FIGS. 1-2.

In some embodiments, the first IC package assembly 300 of FIG. 3 is depicted subsequent to deposition of mold material 122 and simultaneous formation of vias 124 using a mold chase as described herein. The first IC package assembly 300 may be processed in accordance with a first technique described in connection with IC package assemblies 200a and 200b. That is, the first IC package assembly 300 may enter the mold chase for processing having the configuration of IC package assembly 200a with pads 120 disposed on the first package substrate 104. Pins of the mold chase may protect a surface of the pads 120 during deposition of the mold material 122 and simultaneously form the vias 124. For example, the mold material 122 may surround the pins during deposition. Once the mold material 122 has set, the removed pins may leave respective openings in the mold material 122 corresponding with the vias 124. The pads 120 may have a height relative to the surface of the first package substrate 104 that is less than a height of the first die 102 relative to the surface of the first package substrate 104.

In some embodiments, the second IC package assembly 400 of FIG. 4 is depicted subsequent to deposition of mold material 122 and simultaneous formation of vias 124 using a mold chase as described herein. The second IC package assembly 400 may be processed in accordance with a second technique where the second IC package assembly 400 may enter the mold chase for processing having a configuration with pads 120 disposed on the first package substrate 104 and solderable material 126 disposed on the pads 120. According to various embodiments, the pads 120 and solderable material 126 may form second interconnect structures that have a height relative to the surface of the first package substrate 104 that is less than a height of the first die 102 relative to the surface of the first package substrate 104. The solderable material 126 may include, for example, reflown solder balls, which may have a spherical profile. Pins of the mold chase may protect a surface of the solderable material 126 during deposition of the mold material 122 and simultaneously form the vias 124 similarly as described in connection with FIG. 3.

In some embodiments, the third IC package assembly 500 of FIG. 5 is depicted subsequent to deposition of mold material 122 using a mold chase as described herein. The third IC package assembly 500 may be processed in accordance with a third technique where the third IC package assembly 500 may enter the mold chase for processing having a configuration with pads 120 disposed on the first package substrate 104 and solderable material 126 disposed on the pads 120. The solderable material 126 may include, for example, reflown solder balls. According to various embodiments, the pads 120 and solderable material 126 may form second interconnect structures that have a height relative to the surface of the first package substrate 104 that is greater than a height of the first die 102 relative to the surface of the first package substrate 104. Pins of the mold chase may protect a surface of the solderable material 126 during deposition of the mold material 122 to encapsulate a portion of the solderable material 126, as can be seen.

According to various embodiments, a surface of the first die 102 may remain exposed in the respective IC package assemblies 300, 400 and 500 of FIGS. 3-5 subsequent to deposition of the mold material 122. For example, the mold chase may be configured to protect the top surface of the first die 102 during deposition of the mold material 122 to provide an exposed top surface of the first die 102.

FIG. 6 schematically illustrates an example layer-by-layer perspective view of a mold chase 600, in accordance with some embodiments. The mold chase 600 may be manufacturing equipment configured for the deposition of mold material and, in some embodiments, the simultaneous formation of vias through the mold material of an integrated circuit package assembly. According to various embodiments, the mold chase 600 includes a first portion 630 (e.g., bottom chase) and a second portion 632 (e.g., top chase) removably coupled together. One or both of the first portion 630 and the second portion 632 may be configured to move relative to one another to provide a first position where the first portion 630 and the second portion 632 are not in direct contact and a second position where at least a portion of the first portion 630 and the second portion 632 are in direct contact (e.g., as depicted in FIG. 6). In the depicted second position, the first portion 630 and the second portion 632 may be configured to form a vacuum chamber for deposition of the mold material. The mold material may, for example, enter the mold chase 600 by way of mold gate 601.

The first portion 630 may be configured to receive and/or support a package substrate such as, for example, the first package substrate 104. For example, first portion 630 may have a recessed surface 634 configured to receive and support the first package substrate 104. According to various embodiments, the first portion 630 may be configured to receive and/or support the first package substrate 104 in singulated or strip form. A first die 102 may be attached to a surface of the first package substrate 104 using first interconnect structures 106 and second interconnect structures 128 may be disposed on the surface of the first package substrate 104 to route electrical signals of a second die. In various embodiments, the second interconnect structures 128 may include only pads (e.g., pads 120 of FIG. 3) as described in connection with FIG. 3 or may include pads having solderable material (e.g., solderable material 126 of FIGS. 4-5) disposed on the pads as described in connection with FIGS. 4-5.

A protective film 636 may cover a surface of the first portion 630 including the recessed surface 634 to protect surfaces of the first package substrate 104 that come into contact with the protective film 636 from the deposition of the mold material when the first package substrate 104 is positioned in the recessed surface 634, as can be seen. The protective film 636 may be composed of a polymer or other suitable material.

The mold chase 600 may include a pin plate 638 coupled with the second portion 632. The pin plate 638 may be configured to move (e.g., up and down in the FIG. 6) relative to the second portion 632 using, for example, a piston (e.g., piston 738 of FIG. 7) or other suitable means to drive the pin plate 638. Pins 640 are coupled with the pin plate 638. The pins 640 may be configured to press against the second interconnect structures 128 to protect a top surface of the second interconnect structures 128 from receiving deposition of the mold material. In some embodiments, individual pins of the pins 640 may be configured to correspond with individual interconnect structures of the second interconnect structures 128, as can be seen. The pin plate 638 may be configured to apply a force (e.g., using the piston 738 of FIG. 7) between individual pins of the pins 640 and individual interconnect structures of the second interconnect structures 128 to protect the top surface of the second interconnect structures 128 during deposition of the mold material. According to various embodiments, the pins 640 may be further configured to form vias through the mold material during deposition of the mold material.

As can be seen in FIG. 6, only a portion of some of the pins 640 is depicted to avoid obscuring other features of the chase mold 600 and some of the pins 640 on the second interconnect structures 128 may not be depicted at all to avoid obscuring aspects of the second interconnect structures 128. However, to be clear, the pins 640 may extend from the pin plate 638 to the top surface of all second interconnect structures 128, according to various embodiments. Further, only a portion of the pin plate 638 may be depicted in FIG. 6. The pin plate 638 may extend entirely over the first package substrate 104.

In some embodiments, the mold chase 600 may further include a die compression plate 642 coupled with the second portion 632. The die compression plate 642 and the pin plate 638 may be referred to as an "insert", in some embodiments. A compressive material 644 may be disposed on a surface of the die compression plate 642. The die compression plate 642 may be configured to move (e.g., up and down in the FIG. 6) relative to the second portion 632 using, for example, a piston (e.g., piston 742 of FIG. 7) or other suitable means to drive the die compression plate 642. The die compression plate 642 may be configured to press the compressive material 644 against a top surface of the first die 102 during deposition of the mold material to protect the top surface and prevent deposition of the mold material on the top surface. In some embodiments, the die compression plate 642 may be configured to controllably retract to allow the mold material to encapsulate the first die 102 at a controlled height above the first die 102.

The compressive material 644 may be coupled with the die compression plate 642 by molding the compressive material 644 on the die compression plate 642 during fabrication of the die compression plate 642. The compressive material 644 may be composed of a polymer or any other suitable material, according to various embodiments. In some embodiments, the compressive material 644 is configured such that the compressive material 644 does not come into physical contact with the first package substrate 104 when in pressing engagement with the top surface of the first die 102.

As can be seen in FIG. 6, only a portion of the die compression plate 642 and the compressive material 644 is depicted to avoid obscuring other features of the mold chase 600 in relation to the first package substrate 104. In some embodiments, the compressive material 644 may extend over an area corresponding with the top surface of the die 102 and the die compression plate 642 may extend over a the same area. In some embodiments, the die compression plate 642 may extend entirely over the first package substrate 104. In some embodiments, the die compression plate 642 may extend over a same area as the pin plate 638.

According to various embodiments, the pin plate 638 and the die compression plate 642 are independently controlled and activated (e.g., driven) to provide different pressures for the respective areas pressed against the pins 640 and compressive material 644. Such configuration may allow multiple combinations of exposure of the second interconnect structures 128 and die 102 to deposition of the mold material. The chase mold 600 may be configured to simultaneously protect the second interconnect structures 128, protect the die 102 or provide controlled-height encapsulation of the first die 102, and/or form vias through the mold material in a single operation.

In some embodiments, the pins 640 may be configured to pass through corresponding openings in the die compression plate 642, as depicted in FIG. 6. In some embodiments, the compressive material 644 may extend over the second interconnect structures 128 and the pins 640 may be configured to pass through corresponding openings in the compressive material 644. In other embodiments, the die compression plate 642 may extend over the first die 102, but not the second interconnect structures 128 such that the pins 640 do not pass through the die compression plate 642.

According to various embodiments, the mold chase 600 may operate according to the following principles. The mold chase 600 may receive and load the first package substrate 104 as described. The first portion 630 and the second portion 632 may be brought together to a closed soft-clamp position to form a chamber and vacuum pumping may begin. The die compression plate 642 may be driven down to press against the first die 102. The pin plate 638 may be driven down to press against the second interconnect structures 128. The mold material transfer may begin. Molten mold material may flow through the mold gate 601 at a controlled speed. The clamping between the first portion 630 and the second portion 632 may increase to contain the mold material in the cavity until a final hard clamp is achieved. Once the transfer of the mold material is complete, a cure may be performed within the mold chase 600 (e.g., ~90% cure of the mold material) to solidify the mold material. The first portion 630 and the second portion 632 may be separated and the first package substrate 104 may be ejected. A post mold cure may be performed in a cure oven to complete curing of the mold material.

Figure 7:
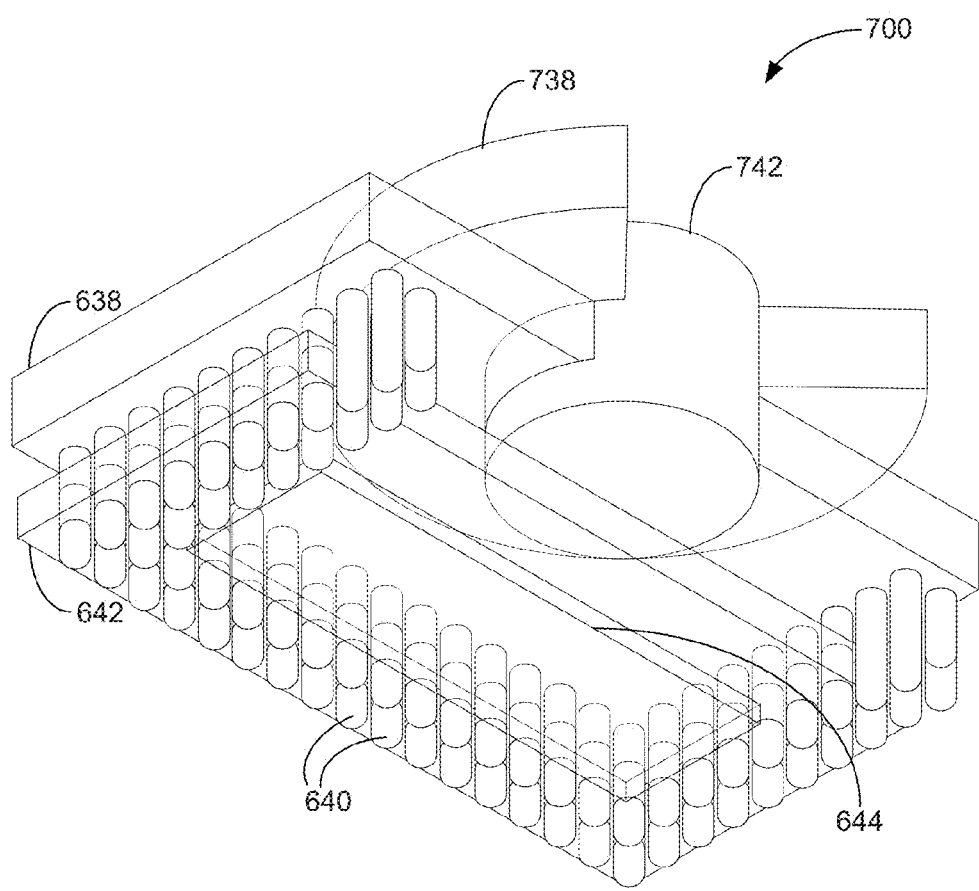
FIG. 7 schematically illustrates an example layer-by-layer perspective view of a configuration of a pin plate and die compression plate of the mold chase, in accordance with some embodiments.

FIG. 7 schematically illustrates an example layer-by-layer perspective view of a configuration 700 (e.g., insert) of a pin plate 638 and die compression plate 642 of the mold chase 600 of FIG. 6, in accordance with some embodiments. The features of FIG. 7 may comport with similarly numbered features of FIG. 6 in various embodiments.

The piston 738 may be configured to drive the pin plate 638 having the pins 640 and the piston 742 may be configured to drive the die compression plate 642 having the compressive material 644. The motion of pistons 738 and 742 may be independently controlled to apply separately configurable pressures. In some embodiments, the pistons 738 and 742 may be driven by springs, pneumatics, motors, or any suitable combination.

Figure 8:
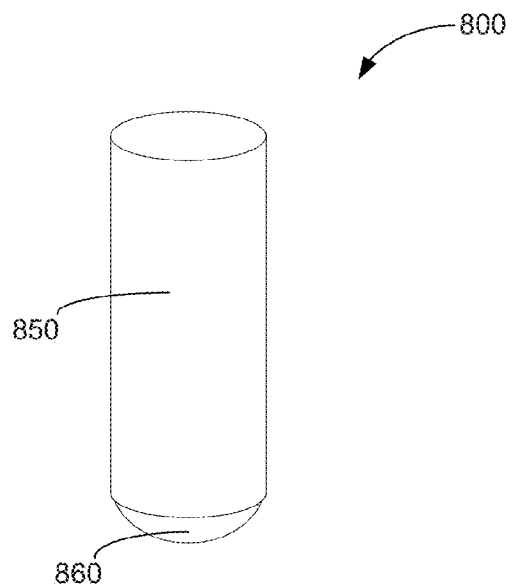
FIG. 8 schematically illustrates an example perspective view of a pin, in accordance with some embodiments.

FIG. 8 schematically illustrates an example perspective view of a pin 800, in accordance with some embodiments. The pin 800 may represent a pin of the pins 640 of FIG. 6, in various embodiments.

According to various embodiments, the pin 800 may have a precise profile such that a via formed by the pin has the precise profile. For example, the pin 800 may have a precise cylindrical profile, as can be seen, such that a via formed by the pin has the same precise cylindrical profile.

In some embodiments, the pin 800 may have a body 850 composed of a structurally rigid material (e.g., stainless steel and like materials) and a tip 860 composed of a polymer such as an elastomer (e.g., rubber) to avoid hard contact between the structurally rigid material and the second interconnect structures 128. The tip 860 may be configured to come in contact with the second interconnect structures 128, under pressure, to mold and provide increased contact with the surface of the second interconnect structures 128 relative to a structurally rigid material. In some embodiments, the tip 860 is configured or shaped such that, under engaging pressure with the second interconnect structures 128, the tip 860 is compressed to provide a shape substantially congruent or contiguous with the precise cylindrical profile of the body 850.

Figure 9:
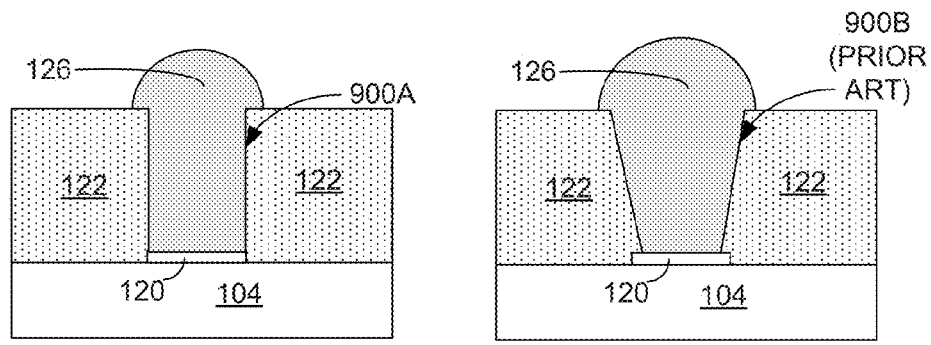
FIG. 9 schematically illustrates an example cross-section side view of a via formed by the mold chase and a via formed by laser drilling, in accordance with some embodiments.

FIG. 9 schematically illustrates an example cross-section side view of a via formed by the mold chase 600 of FIG. 6 (e.g., pin-formed via 900A) and a via formed by laser drilling (laser-drilled via 900B), in accordance with some embodiments. As can be seen, the pin-formed via 900A may have a profile with a precise cylindrical shape where a diameter of a circular region (or similar dimension of another shape) of a top portion of the pin-formed via 900A and bottom portion of the pin-formed via 900A are substantially the same. The laser-drilled via 900B may have a profile with a conical shape where a diameter of a circular region (or similar dimension of another shape) of a top portion of the via 900B is larger than the diameter of the bottom portion, resulting in a sloped sidewall profile, as can be seen.

The profile of the laser-drilled via 900B may increase a likelihood that solderable material 126 at a top portion of the laser-drilled via 900B will bridge and cause shorting of interconnect structures (e.g., second interconnect structures 128 of FIG. 1) formed by the solderable material 126. Such likelihood of bridging in the laser-drilled via 900B may increase as interconnect structures increase in density with smaller pitch between the interconnect structures to provide a smaller form factor of a POP assembly.

The profile of the pin-formed via 900A, on the other hand, maintains a substantially constant cross-section profile from a bottom portion of the pin-formed via 900A to a top portion of the pin-formed via 900A, which may reduce a likelihood of bridging and, thus, shorting of solderable material 126 at the top portion of the pin-formed via 900A with other pin-formed vias. Such feature may be particularly advantageous as interconnect structures increase in density with smaller pitch between the interconnect structures.

Figure 10:
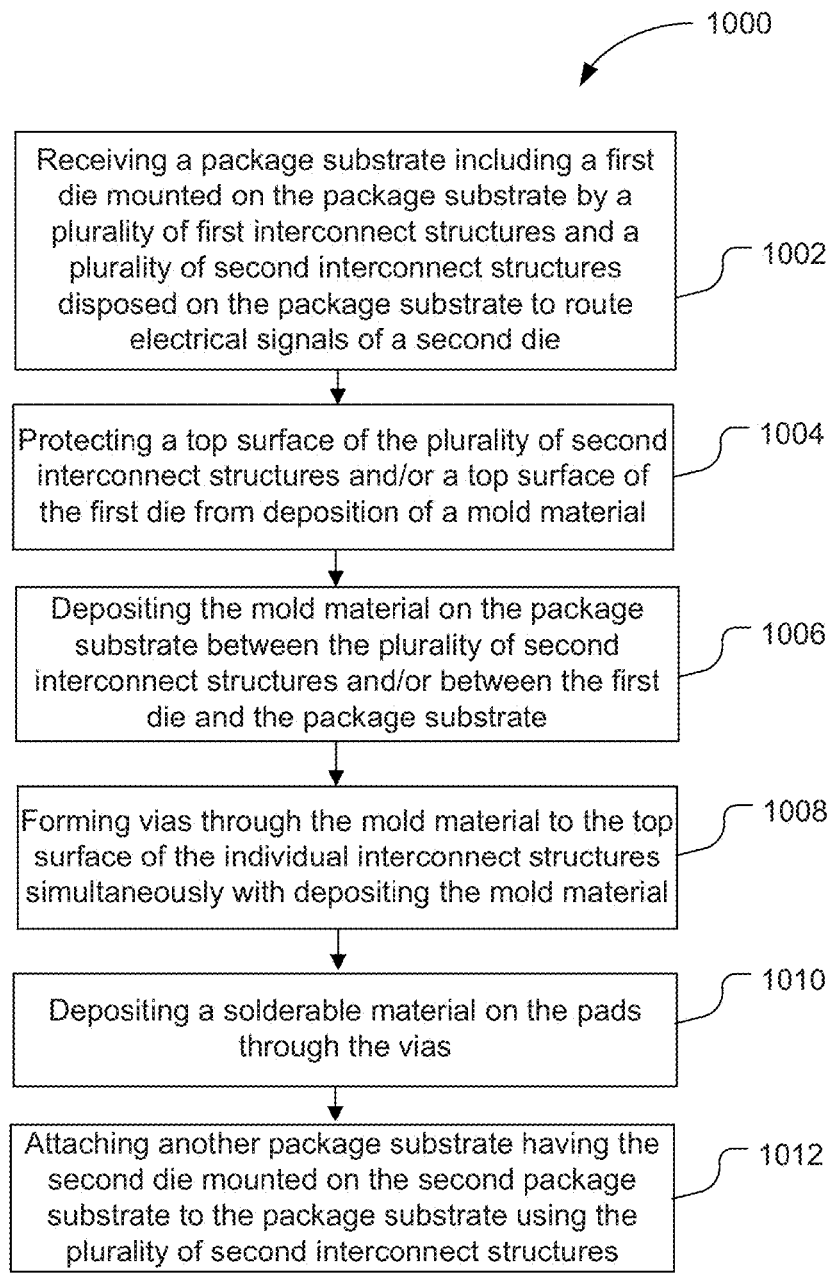
FIG. 10 is a flow diagram for a method of fabricating an IC package assembly, in accordance with some embodiments.

FIG. 10 is a flow diagram for a method 1000 of fabricating an IC package assembly (e.g., IC package assembly 100 of FIG. 1), in accordance with some embodiments. The method 1000 may comport with embodiments described in connection with FIGS. 1-9.

At 1002, the method 1000 may include receiving a package substrate (e.g., first package substrate 104 of FIG. 1) including a first die (e.g., first die 102 of FIG. 1) mounted on the package substrate by a plurality of first interconnect structures (e.g., first interconnect structures 106 of FIG. 1) and a plurality of second interconnect structures (e.g., second interconnect structures 128) disposed on the package substrate to route electrical signals of a second die (e.g., second die 202 of FIG. 1). At 1004, the method 1000 may include protecting a top surface of the plurality of second interconnect structures and/or a top surface of the first die from deposition of a mold material (e.g., mold material 122 of FIG. 1). At 1006, the method 1000 may include depositing the mold material on the package substrate between the plurality of second interconnect structures and/or between the first die and the package substrate.

At 1008, the method 1000 may include forming vias (e.g., vias 124 of FIG. 1) through the mold material to the top surface of the second interconnect structures simultaneously with depositing the mold material at 1006. In some embodiments, protecting at 1004 and forming the vias at 1008 are simultaneously performed by applying a force between pins (e.g., pins 640 of FIG. 6) of a fabrication equipment (e.g., mold chase 600 of FIG. 6) and the top surface of the second interconnect structures.

In some embodiments, the method 1000 may include forming vias at 1008 when the package substrate received at 1002 has second interconnect structures having a height relative to a surface of the package substrate that is less than a height of the first die relative to the surface of the package substrate (e.g., to provide an IC package assembly 300 or 400 of respective FIGS. 3-4). In an embodiment, the second interconnect structures disposed on the package substrate received at 1002 are pads resulting in an IC package assembly 300 of FIG. 3. In such embodiment, forming the vias at 1008 may provide vias formed through the mold material to the top surface of the pads. In another embodiment, the second interconnect structures disposed on the package substrate received at 1002 include pads having solderable material disposed on the pads resulting in an IC package assembly 400 of FIG. 4. In such embodiment, forming the vias at 1008 may provide vias formed through the mold material to the top surface of the solderable material.

In some embodiments, the method 1000 may not include forming vias through the mold material to the top surface of the second interconnect structures. For example, the package substrate received at 1002 may have second interconnect structures that have a height relative to a surface of the package substrate that is greater than a height of the first die relative to the surface of the package substrate (e.g., to provide an IC package assembly 500 of FIG. 5). In such embodiment, the pins may protect a top surface of the second interconnect structures from contamination by mold material while depositing the mold material at 1006, but may not form vias through the mold material.

At 1010, the method 1000 may include depositing a solderable material on the pads through the vias. Such action may be performed for a package substrate received at 1002 where the second interconnect structures only include pads. In some embodiments, additional solderable material may be further deposited on solderable material in vias configured as described in connection with IC package assembly 300 of FIG. 3 to provide more solderable material for attaching another package substrate at 1012.

At 1012, the method 1000 may include attaching another package substrate (e.g., second package substrate 204 of FIG. 1) having the second die mounted on the second package substrate to the package substrate using the plurality of second interconnect structures. The resulting IC package assembly may be a POP assembly in some embodiments. A solder reflow process may be used to form a solder connection between the solderable material in the vias and corresponding structures on the second package substrate. In other embodiments, the second die may be directly coupled with the second interconnects.

According to various embodiments, receiving the package substrate at 1002, protecting the top surface of the individual interconnect structures at 1004, protecting the top surface of the die at 1004, depositing the mold material at 1006 and/or forming the vias through the mold material at 1008 are performed by a mold chase 600 of FIG. 6 as described herein. The mold chase 600 may be further configured to at least partially cure the mold material in some embodiments.

Figure 11:
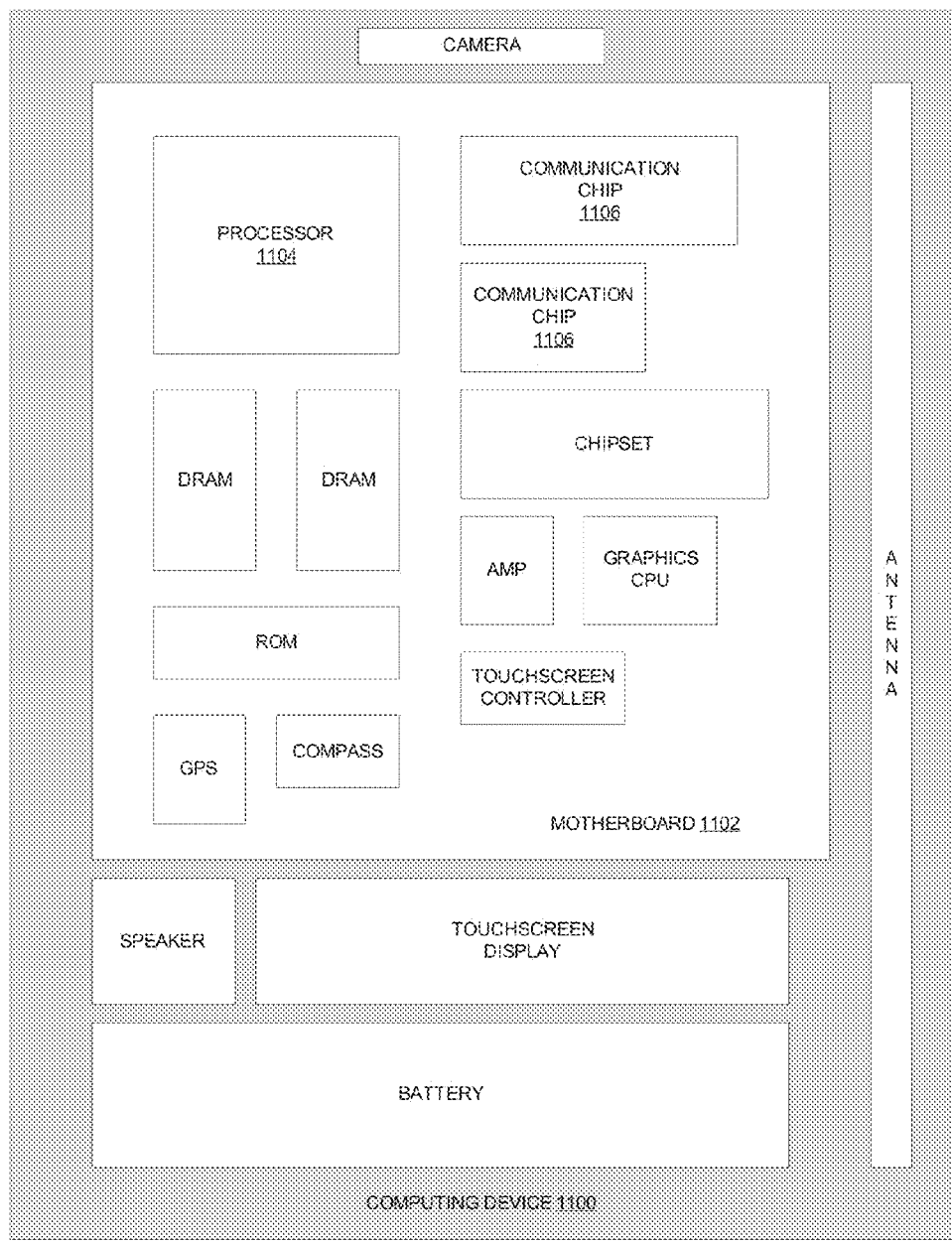
FIG. 11 schematically illustrates a computing device in accordance with one implementation of the invention.

Embodiments of the present disclosure may be implemented into a system using any suitable hardware and/or software to configure as desired. FIG. 11 schematically illustrates a computing device 1100 in accordance with one implementation of the invention. The computing device 1100 may house a board such as motherboard 1102. The motherboard 1102 may include a number of components, including but not limited to a processor 1104 and at least one communication chip 1106. The processor 1104 may be physically and electrically coupled to the motherboard 1102. In some implementations, the at least one communication chip 1106 may also be physically and electrically coupled to the motherboard 1102. In further implementations, the communication chip 1106 may be part of the processor 1104.

Depending on its applications, computing device 1100 may include other components that may or may not be physically and electrically coupled to the motherboard 1102. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1106 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other embodiments.

The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 may include a die (e.g., first die 102 or second die 202 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 1106 may also include a die (e.g., first die 102 or second die 202 of FIG. 1) in an IC package assembly (e.g., IC package assembly 100 of FIG. 1) as described herein. In further implementations, another component (e.g., memory device or other integrated circuit device) housed within the computing device 1100 may contain a die (e.g., first die 102 or second die 202 of FIG. 1) in an IC package assembly (e.g., IC package assembly 100 of FIG. 1) as described herein.

The computing device 1100 may be coupled with the mold chase 600 of FIG. 6 in some embodiments and may be configured to execute instructions stored on a storage medium described herein to perform actions described in connection with method 1000 of FIG. 10, or to drive the pistons 738 and 742 of FIG. 7, or perform other actions as described herein.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. Fabrication equipment comprising:
a first portion configured to receive a package substrate for deposition of a mold material
a second portion coupled with the first portion;
a pin plate coupled with the second portion, the pin plate having a plurality of pins coupled to the pin plate and configured to correspond with a plurality of interconnect structures disposed on the package substrate, wherein the pin plate is configured to apply a force between individual pins of the plurality of pins and a top surface of individual interconnect structures of the plurality of interconnect structures to protect the top surface of the individual interconnect structures during deposition of the mold material; and
a die compression plate coupled to the second portion and disposed between the pin plate and the first portion, the die compression plate having a compressive material that is configured to press against and protect a surface of the first die during deposition of the mold material.

2. The fabrication equipment of claim 1, wherein the plurality of pins are further configured to form vias through the mold material during deposition of the mold material.

3. The fabrication equipment of claim 2, wherein the pins of the fabrication equipment have a precise cylindrical profile such that the vias have the precise cylindrical profile.

4. The fabrication equipment of claim 1, wherein the plurality of pins are metal pins having a polymer tip that is configured to contact the top surface of the individual interconnect structures.

5. The fabrication equipment of claim 1, wherein the pin plate is configured to move independently from the die compression plate.

6. The fabrication equipment of claim 1, wherein:
the pin plate is coupled with a first piston, the first piston being configured to drive the pin plate; and
the die compression plate is coupled with a second piston, the second piston being configured to drive the die compression plate.

7. The fabrication equipment of claim 1, wherein:
the first portion has a recessed surface configured to receive and support the package substrate; and
the recessed surface is covered with a protective film configured to protect surfaces of the package substrate that come in contact with the protective film from deposition of the mold material when the package substrate is positioned in the recessed surface.

8. The fabrication equipment of claim 1, wherein the first portion and the second portion are configured to form a vacuum chamber during deposition of the mold material.

9. The fabrication equipment of claim 1, further comprising:
a mold gate configured to allow the mold material to flow onto the package substrate in a region enclosed by the first portion and the second portion during deposition of the mold material.

10. The fabrication equipment of claim 1, wherein the fabrication equipment is a mold chase for simultaneous partial mold encapsulation of the first die and formation of vias through the mold encapsulation.

* * * * *